United States Patent
Margalit

(10) Patent No.: US 9,502,612 B2
(45) Date of Patent: Nov. 22, 2016

(54) LIGHT EMITTING DIODE PACKAGE WITH ENHANCED HEAT CONDUCTION

(71) Applicant: Mordehai Margalit, Zichron Yaaqov (IL)

(72) Inventor: Mordehai Margalit, Zichron Yaaqov (IL)

(73) Assignee: Viagan Ltd., Aichron Yaakov (IL)

( * ) Notice: Subject to any disclaimer, the term of this patent is extended or adjusted under 35 U.S.C. 154(b) by 0 days.

(21) Appl. No.: 14/047,715

(22) Filed: Oct. 7, 2013

(65) Prior Publication Data

US 2014/0042479 A1   Feb. 13, 2014

Related U.S. Application Data

(63) Continuation-in-part of application No. 13/424,875, filed on Mar. 20, 2012, now Pat. No. 9,406,854, which is a continuation-in-part of application No. PCT/IL2010/000772, filed on Sep. 20, 2010.

(60) Provisional application No. 61/710,156, filed on Oct. 5, 2012, provisional application No. 61/244,046, filed on Sep. 20, 2009, provisional application No. 61/351,875, filed on Jun. 5, 2010.

(51) Int. Cl.
*H01L 33/48* (2010.01)
*H01L 33/62* (2010.01)
*H01L 33/00* (2010.01)
*H01L 33/10* (2010.01)
(Continued)

(52) U.S. Cl.
CPC ............. *H01L 33/10* (2013.01); *H01L 33/382* (2013.01); *H01L 33/486* (2013.01); *H01L 33/62* (2013.01); *H01L 33/46* (2013.01); *H01L 33/48* (2013.01); *H01L 33/483* (2013.01); *H01L 33/52* (2013.01); *H01L 33/64* (2013.01); *H01L 33/647* (2013.01); *H01L 2224/24* (2013.01); *H01L 2924/12044* (2013.01); *H01L 2924/1461* (2013.01); *H01L 2933/0066* (2013.01)

(58) Field of Classification Search
CPC ... H01L 33/64; H01L 33/644; H01L 33/641; H01L 33/642; H01L 33/645; H01L 33/647; H01L 33/648; H01L 33/483; H01L 33/486; H01L 2933/0033; H01L 2933/0075; H01L 2933/64; H01L 2933/644; H01L 33/48; H01L 33/62
USPC ........................................... 257/98, 99
See application file for complete search history.

(56) References Cited

U.S. PATENT DOCUMENTS 4,797,715 A * 1/1989 Thillays ............... H01L 33/005
257/627
6,501,091 B1   12/2002 Bawendi
(Continued)

OTHER PUBLICATIONS

US International Searching Authority of the Patent Cooperation Treaty, "Application No. PCT/IB13/03043 International Search Report", Aug. 18, 2014.

*Primary Examiner* — David Zarneke
(74) *Attorney, Agent, or Firm* — Intrinsic Law Corp.; Ibrahim M. Hallaj

(57) ABSTRACT

A light emitting diode (LED) device and packaging with enhance heat conduction. An LED in a wafer level processing (WLP) package is disclosed using vias in the silicon to route the electrical connections to the LED backside and a dedicated hole in the silicon with a direct heat conduction route from the LED to the printed circuit board. Certain layers act to promote mechanical, electrical, thermal, or optical characteristics of the device. The device avoids or ameliorates heat dissipation problems found in conventional LED devices. Some embodiments include a plurality of optically permissive layers, including an optically permissive cover substrate comprising phosphors and/or quantum dots.

12 Claims, 12 Drawing Sheets

(51) Int. Cl.
*H01L 33/38* (2010.01)
*H01L 33/52* (2010.01)
*H01L 33/46* (2010.01)
*H01L 33/64* (2010.01)

(56) References Cited

U.S. PATENT DOCUMENTS

| | | |
|---|---|---|
| 7,232,754 B2 | 6/2007 | Kirby et al. |
| 7,411,225 B2* | 8/2008 | Kim .................... H01L 33/486 257/100 |
| 7,910,940 B2 | 3/2011 | Koike et al. |
| 7,951,625 B2 | 5/2011 | Kamei |
| 8,044,412 B2* | 10/2011 | Murphy ................ H01L 23/60 257/81 |
| 8,278,213 B2 | 10/2012 | Kameyama et al. |
| 2003/0006418 A1 | 1/2003 | Emerson et al. |
| 2005/0017258 A1 | 1/2005 | Fehrer et al. |
| 2006/0006404 A1 | 1/2006 | Ibbetson et al. |
| 2006/0011935 A1 | 1/2006 | Krames |
| 2006/0073692 A1 | 4/2006 | Yoshida et al. |
| 2006/0081869 A1 | 4/2006 | Lu et al. |
| 2006/0092532 A1 | 5/2006 | Ouderkirk et al. |
| 2006/0097276 A1* | 5/2006 | Chen .................... H01L 33/62 257/99 |
| 2006/0163683 A1 | 7/2006 | Roth et al. |
| 2006/0208271 A1* | 9/2006 | Kim .................... H01L 33/486 257/100 |
| 2006/0278885 A1 | 12/2006 | Tain et al. |
| 2006/0284321 A1 | 12/2006 | Wu et al. |
| 2007/0166851 A1 | 7/2007 | Tran et al. |
| 2007/0228386 A1* | 10/2007 | Shie .................... H01L 33/486 257/79 |
| 2008/0029570 A1* | 2/2008 | Shelton ................ A61B 17/068 227/175.1 |
| 2008/0067534 A1* | 3/2008 | Hsieh .................... H01L 33/486 257/98 |
| 2008/0068845 A1 | 3/2008 | Aida et al. |
| 2009/0108283 A1 | 4/2009 | Kadotani et al. |
| 2009/0173958 A1 | 7/2009 | Chakraborty et al. |
| 2009/0262516 A1* | 10/2009 | Li .......................... H01L 33/56 362/84 |
| 2009/0267096 A1 | 10/2009 | Kim |
| 2009/0273002 A1 | 11/2009 | Chiou et al. |
| 2009/0283787 A1 | 11/2009 | Donofrio et al. |
| 2009/0291518 A1 | 11/2009 | Kim et al. |
| 2010/0025718 A1* | 2/2010 | Shi ........................ H01L 33/483 257/99 |
| 2010/0053929 A1 | 3/2010 | Bisberg |
| 2010/0068421 A1 | 3/2010 | Tse et al. |
| 2010/0148193 A1 | 6/2010 | Duong et al. |
| 2010/0207145 A1 | 8/2010 | Yoo |
| 2011/0006322 A1* | 1/2011 | Li ........................ H01L 33/486 257/98 |
| 2011/0309382 A1 | 12/2011 | Lowgren |
| 2012/0034716 A1* | 2/2012 | Lin ........................ H01L 33/58 438/27 |
| 2013/0049564 A1* | 2/2013 | Jung .................... H01S 5/02469 313/45 |
| 2013/0105978 A1* | 5/2013 | Hung .................... H01L 33/60 257/751 |
| 2013/0294471 A1* | 11/2013 | Palaniswamy ........ H01L 33/486 372/43.01 |
| 2014/0103798 A1* | 4/2014 | Yamanaka ............ H05B 33/04 313/512 |
| 2014/0110728 A1* | 4/2014 | Lee ........................ H01L 24/16 257/88 |

* cited by examiner

LIGHT EMITTING DIODE PACKAGE WITH ENHANCED HEAT CONDUCTION

RELATED APPLICATIONS

This application is related to and claims the benefit and priority of U.S. Provisional Application No. 61/710,156 entitled, "Light Emitting Diode Package with Enhanced Heat Conduction" filed on Oct. 5, 2012, which is hereby incorporated by reference. This application is also a continuation in part of U.S. application Ser. No. 13/424,875 having the same title, claiming the benefit and priority of U.S. Provisional Application Nos. 61/244,046, filed on Sep. 20, 2009, and 61/351,875, filed on Jun. 5, 2010, as well as to PCT Application Number PCT/IL2010/000772, filed Sep. 20, 2010.

TECHNICAL FIELD

The present application is directed to a light emitting diode (LED) device implemented on a wafer substrate layer and permits efficient thermal conductivity properties and repeatable manufacture of the same and can be used in FET, RF and power transistor applications.

BACKGROUND

A light emitting diode (LED) is a semiconductor device that is configured to receive electrical power to stimulate an output of electromagnetic radiation commonly in the visible range of the spectrum (light). Portions of a LED comprise doped semiconductor materials that operate to combine charge in a way that releases light energy from the body of the LED material. While the irradiance depends on the operating conditions of the LED, the wavelength of the light energy is determined by the band gap of the semiconductor materials, in addition to external interaction with various active optical covers and encapsulants.

Packaging of electronic devices, such as light emitting diodes (LEDs) and other devices, represent a major cost in the production of electronic parts. In one non-limiting example, LEDs which offer long lifetime, compact form factor, superior energy efficiency, and RohS compliancy are expensive due to the packaging requirements which include sealing, optics, phosphor and efficient heat conduction. There have been numerous efforts to reduce the cost of the electronic device packaging by using silicon based wafer level assembly technologies. However, these approaches still require a carrier chip for the electronic device and in most cases the carrier chip doubles the cost, and in the case of an LED triples the heat resistivity.

Specifically, when electrical current is passed through a LED (i.e., switched on), carrier electrons recombine with holes within the device releasing energy in the form of photons. This effect is called electroluminescence, and the color of the light (corresponding to the energy of the photon) is determined by the energy band gap of the semiconductor. LEDs are often small in radiative area (less than 1 mm$^2$). Integrated optical components may be used to shape or change its radiation pattern.

A LED package can also incorporate and perform optical functions. For example, a LED package can include optical materials and/or structures, such as lenses, diffusors, light scattering layers, etc., that can direct light output by the semiconductor chip in a desired manner. These are typically bonded to the transmission face of the LED.

Light emitting devices generally include a semiconductor chip, or die, including a p-n junction formed upon an epitaxial layer grown on a substrate, such as, sapphire, silicon, silicon carbide, or gallium arsenide. The substrate may subsequently be trimmed, patterned, or removed altogether. In addition to phosphor luminescent transitions, the wavelength distribution of the light generated by the LED depends on the material from which the p-n junction is fabricated and the structure of the thin epitaxial layers that make up the active region of the device.

The p-n junction semiconductor die is typically enclosed in a package. A LED package can perform a number of functions and provide a number of benefits. For example, a LED package can provide mechanical support and environmental protection for the semiconductor die, as well as providing electrical leads for connecting the die to an external circuit, and heat sinks for efficient heat extraction from the chip.

It is often desirable to incorporate phosphor into a solid state light emitting device package to enhance the emitted radiation in a particular frequency band and/or to convert at least some of the radiation to another frequency band. Depending on the application, phosphorescent coatings and/or suspensions are often used to broaden the bandwidth of the emitted light. Phosphors absorb some of the photons emitted from the LED and temporarily stores its energy before releasing it in another wavelength photon.

In general, phosphors absorb light having shorter wavelengths and re-emit light having longer wavelengths. As such, some or all of the light emitted by the LED chip at a first wavelength may be absorbed by the phosphor particles, which may responsively emit light at a second wavelength. For example, a single blue emitting LED chip may be surrounded with a yellow phosphor, such as cerium-doped yttrium aluminum garnet (YAG). The resulting light, which is a combination of blue light and yellow light, may appear white to an observer. Photo luminescent events, in which a chemical substrate absorbs and then re-emits a photon of light, are fast, on the order of 10 nanoseconds. Light is absorbed and emitted at these fast time scales in cases where the energy of the photons involved matches the available energy states and allowed transitions of the substrate.

Light-emitting diodes are used in applications as diverse as aviation lighting, automotive lighting, advertising, general lighting, and traffic signals. LEDs have allowed new text, video displays, and sensors to be developed, while their high switching rates are also useful in advanced communications technology. LEDs are used as indicator lamps in many devices and are increasingly used for general lighting. Appearing as practical electronic components in 1962, early LEDs emitted low-intensity red light, but modern versions are available across the visible, ultraviolet, and infrared wavelengths, with very high brightness.

LEDs have many advantages over incandescent light sources including lower energy consumption, longer lifetime, improved physical robustness, smaller size, and faster switching. However, LEDs powerful enough for room lighting are relatively expensive, and require more precise current and heat management than compact fluorescent lamp sources of comparable output.

LEDs compare favorably to other sources of light and are especially useful in certain applications and markets. For example, LED lighting generally provides advantages with respect to energy efficiency, compact, rugged, long-lasting design and form factor, as well as other features. LED lighting compares favorably with other sources in the amount of light energy generated in the visible electromagnetic spectrum compared to the infra-red or heat energy wasted by the light source. In addition, LED lights include fewer environmentally damaging components when compared to other light forms, and therefore provide better compliance with restrictions on hazardous substances (RohS) regulations.

That said, conventional LED devices can be relatively costly to manufacture by some metrics when compared to other light sources. One reason for this is the exacting packaging requirements for manufacturing LEDs. LED packaging calls for proper clean conditions, micro-fabrication facilities similar to other semiconductor manufacturing operations, sealing requirements, optical requirements, the use of phosphor in LED applications, as well as packaging that is designed to efficiently handle the conduction of heat generated in the devices.

Efforts have been made to reduce the cost of conventional LED packaging which uses silicon (Si) or ceramic based carrier substrates. LEDs mounted on an individual chip scale carrier substrate are more expensive to process. Alternatively, LEDs are mounted on a carrier wafer, where the packaging process is done on many LEDs in parallel and the packaged LEDs are singulated at the end of the packaging process, results in a lower cost for the packaged LEDs. The wafer based approach is termed wafer level assembly packaging (WLP).

Wafer-level packaging consists of extending the wafer fab processes to include device interconnection and device protection processes. Other types of packaging performs wafer dicing first and places the individual die in a plastic package followed by attaching the solder bumps. Wafer-level packaging involves attaching the top and bottom outer layers of packaging, and the solder bumps, to integrated circuit while still in the wafer, and then wafer dicing.

However, these conventional techniques still require the use of a carrier substrate to support the LED, which can double the cost of making and packaging the LED device. In addition, the carrier substrate greatly increases the thermal resistivity of the device and adversely affects its heat removal characteristics. Hence it is desirable to provide a wafer level package for LEDs which does not require any carrier substrate and uses the LED die only, alternatively, the package provides a direct thermal connection from the LED to the heat sink for efficient removal of the generated heat. Accordingly, there is a need for LED devices that do not suffer from some or all of the above problems.

SUMMARY

As mentioned above, the present inventions related to new and improved methods and apparatus for providing a light emitting diode package which efficiently removes heat and reflects optical energy away from a carrier wafer. Specifically, an improved LED in a wafer level processed (WLP) package is disclosed using vias in the silicon to route the electrical connections to the LED backside and a dedicated hole in the silicon with a direct heat conduction route from the LED to the printed circuit board.

In some aspects, the present apparatus provides a light emitting device comprising a carrier wafer with an etched recess and a semiconductor LED including doped and intrinsic regions thereof. The semiconductor LED is affixed to said carrier wafer proximate to the recess, and a thermally conductive layer disposed adjacent to the semiconductor LED in the recess. In some aspects, optical reflectors are disposed on spacers on the carrier wafer. In other aspects, a substantially optically transmissive layer covers the semiconductor LED.

In yet other aspects, said at least one optically reflective surface comprises metal or a dielectric stack. In another aspect, the semiconductor LED is affixed to said carrier wafer with an adhesive material which has the property of high thermal conductivity. In other aspects, the semiconductor LED is affixed to said carrier wafer with an adhesive material which has the property of optical diffusion, transmission, reflection, or combination thereof. In another aspect, the thermally conductive layer comprises metal or an organic material with a physical property of high thermal conductivity.

IN THE DRAWINGS

Figure 4:
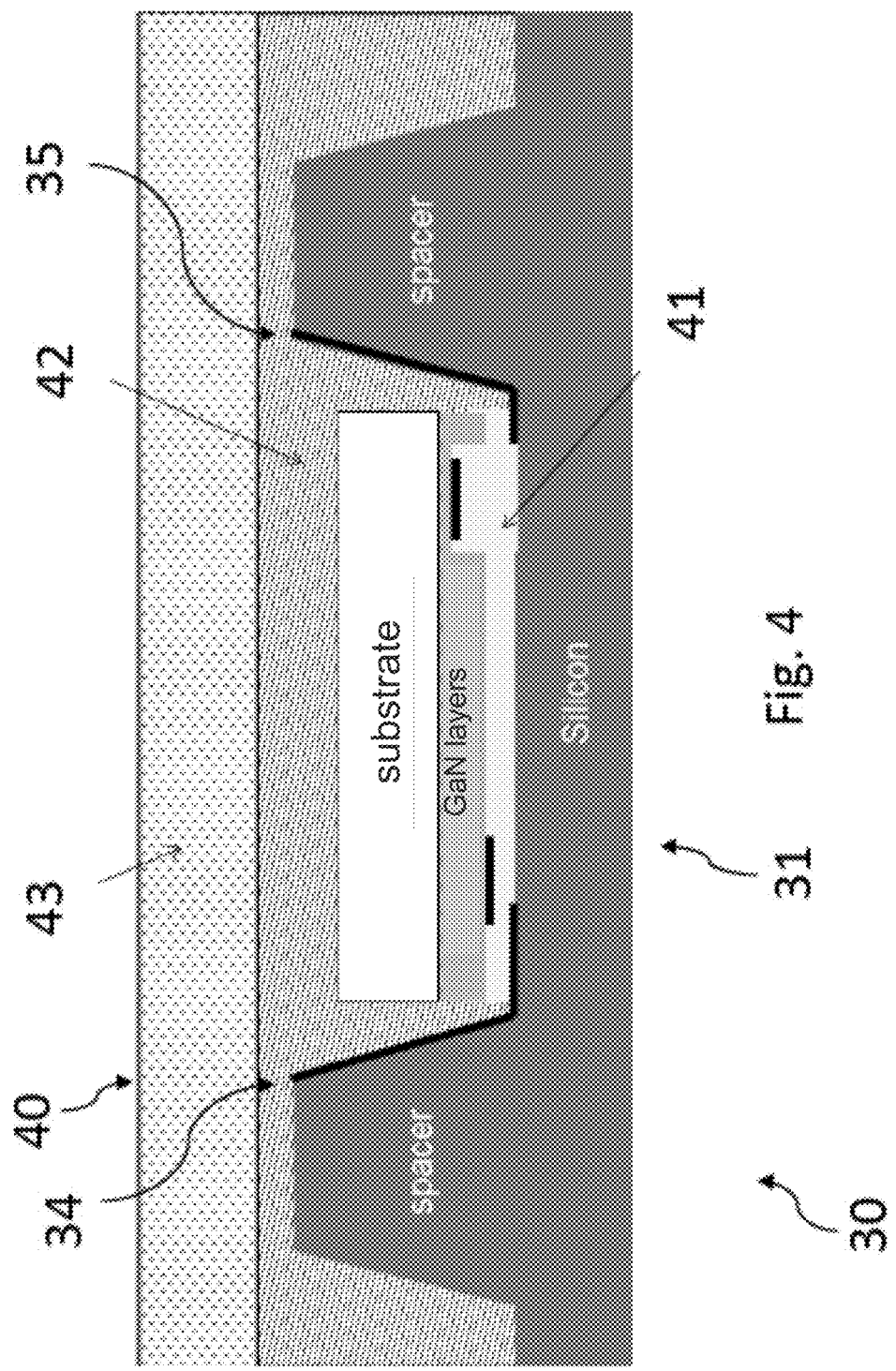
Figure 5:
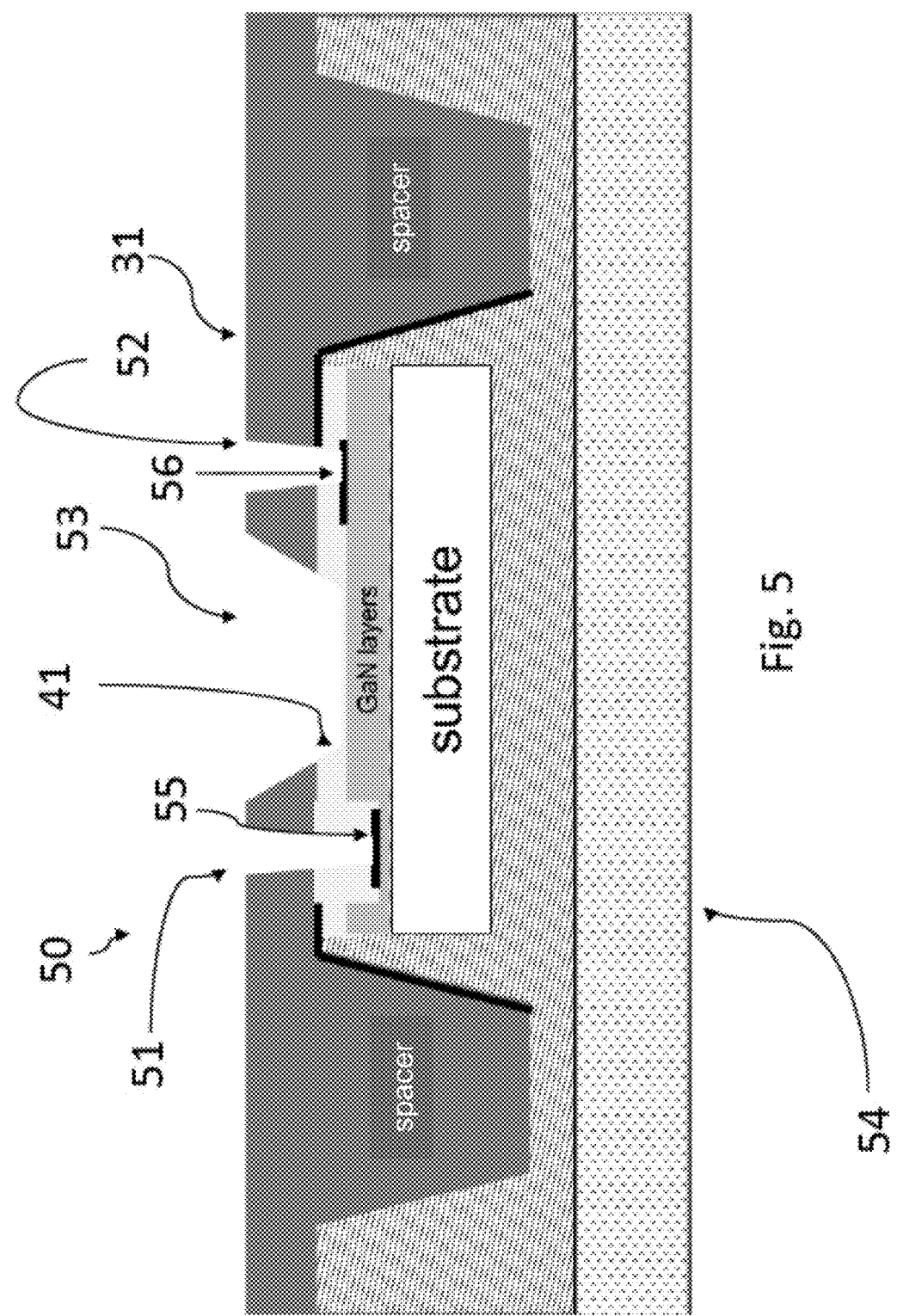
Figure 6:
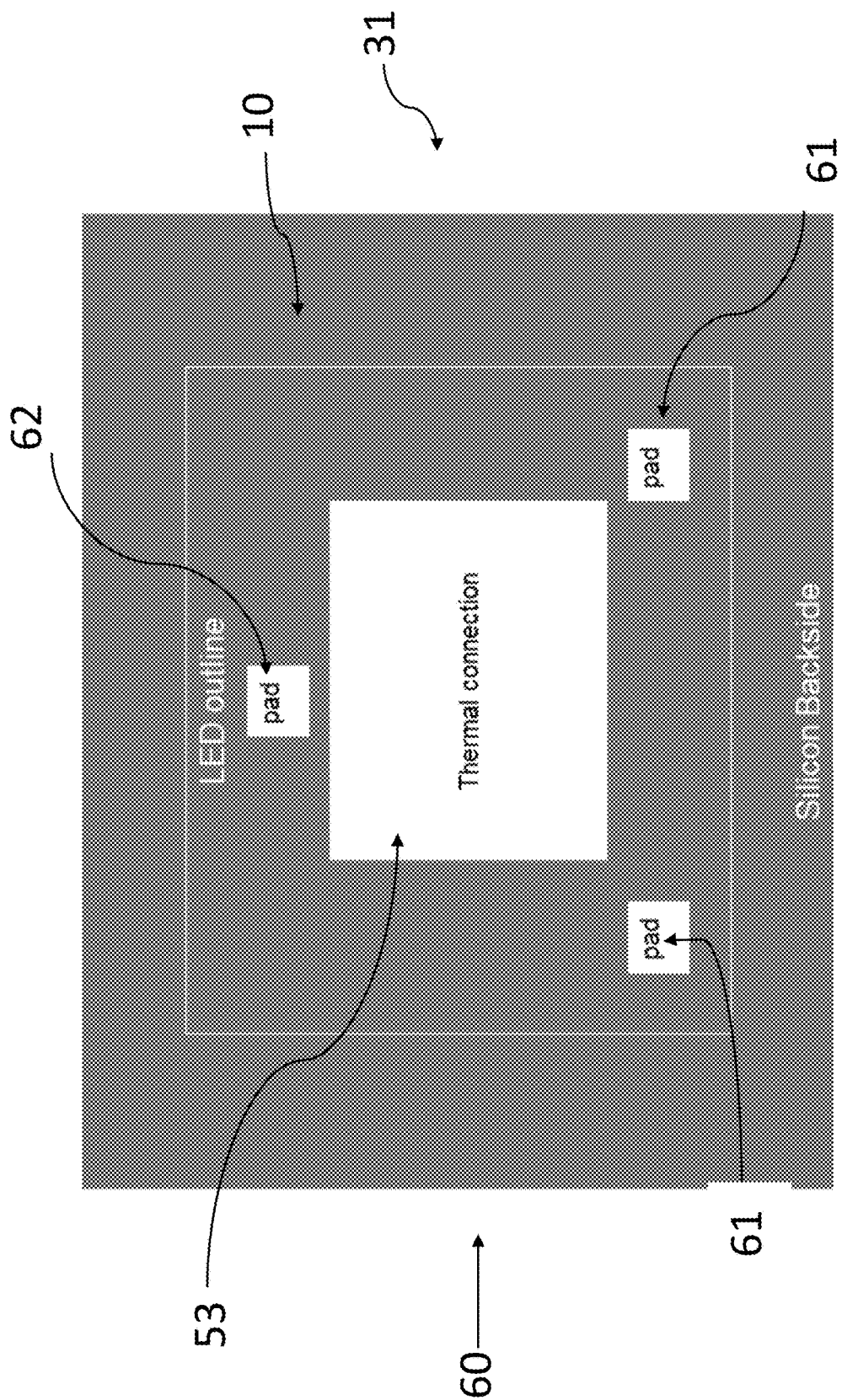
Figure 7:
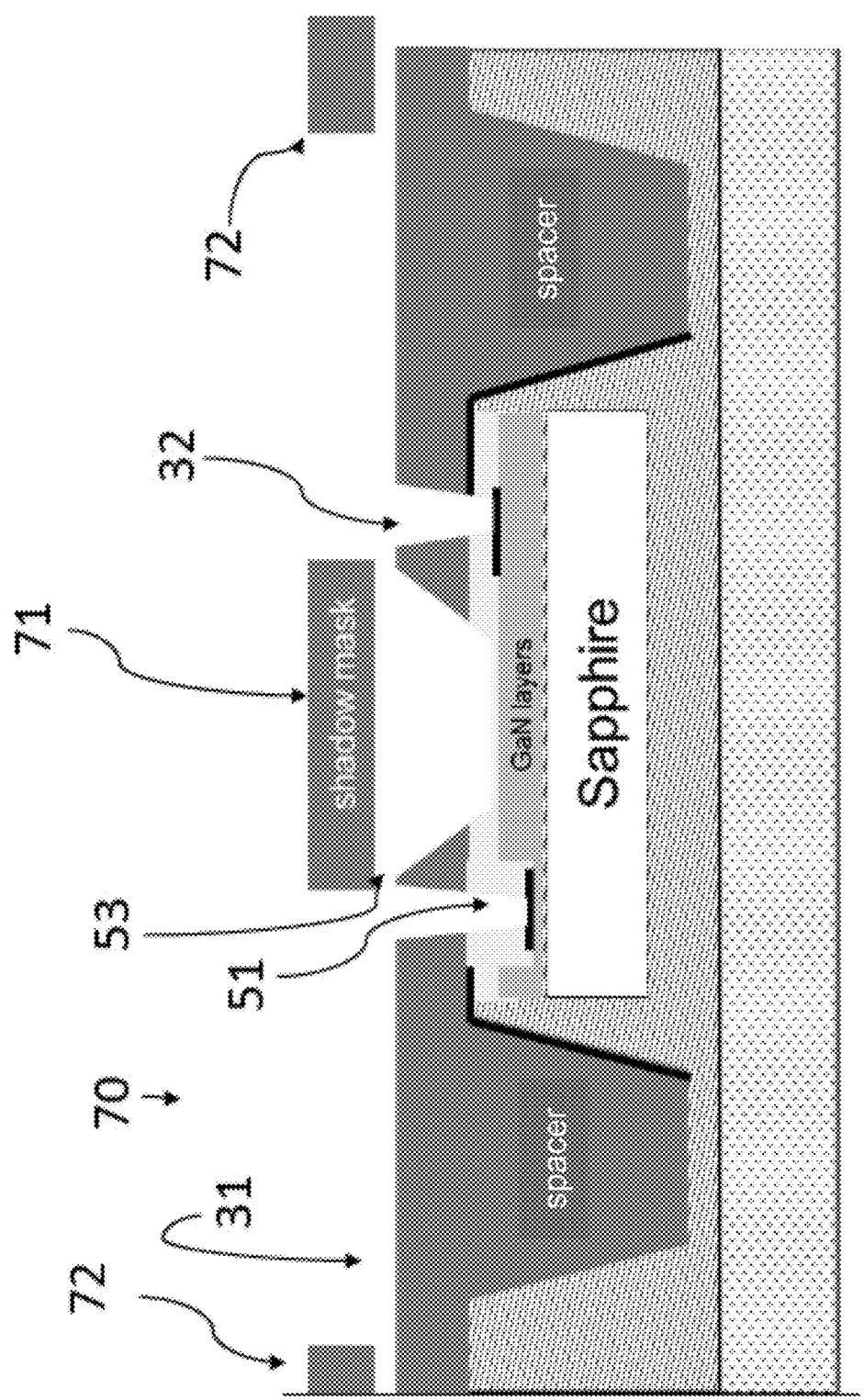
Figure 8:
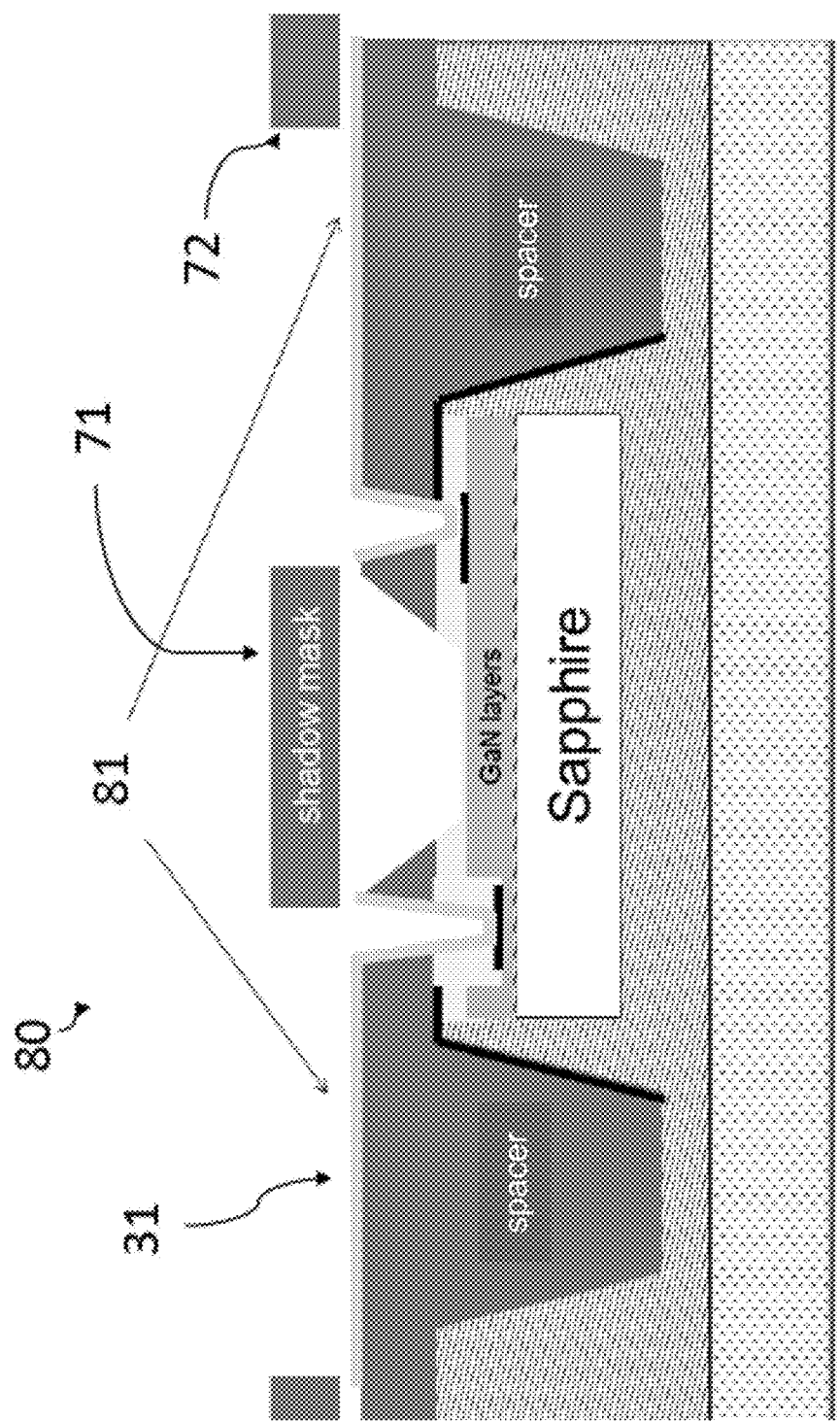
Figure 9:
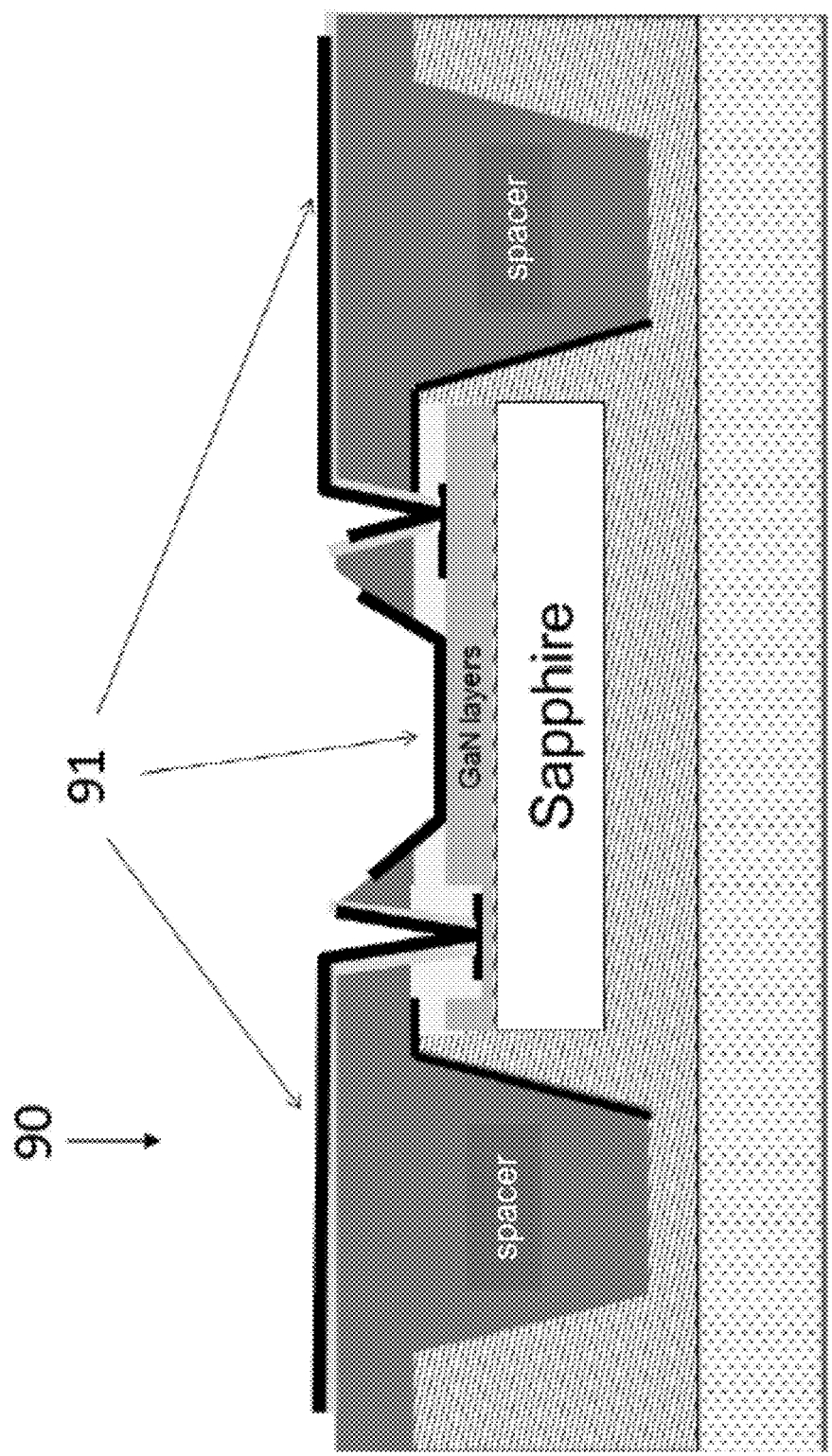
Figure 10:
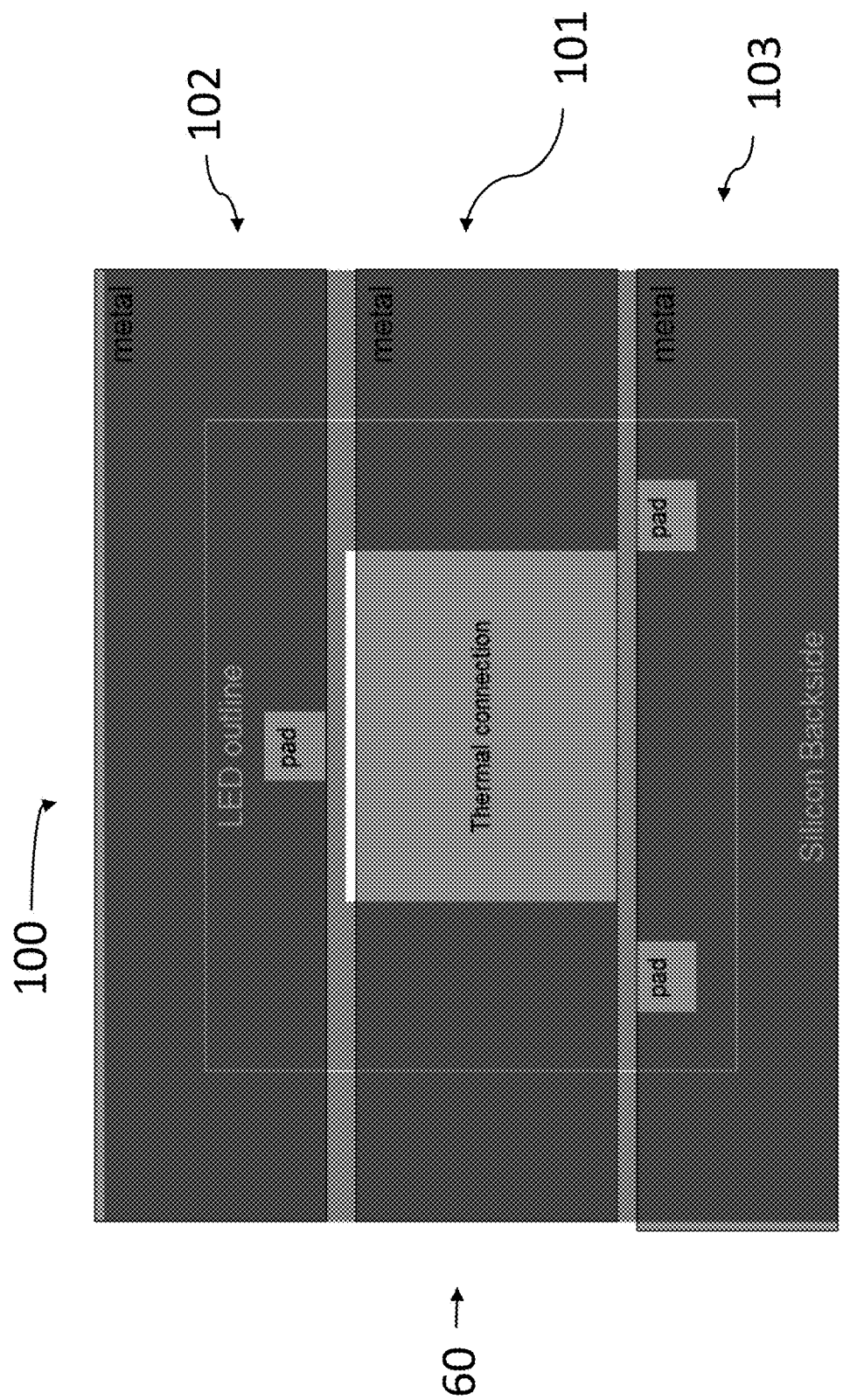
Figure 11:
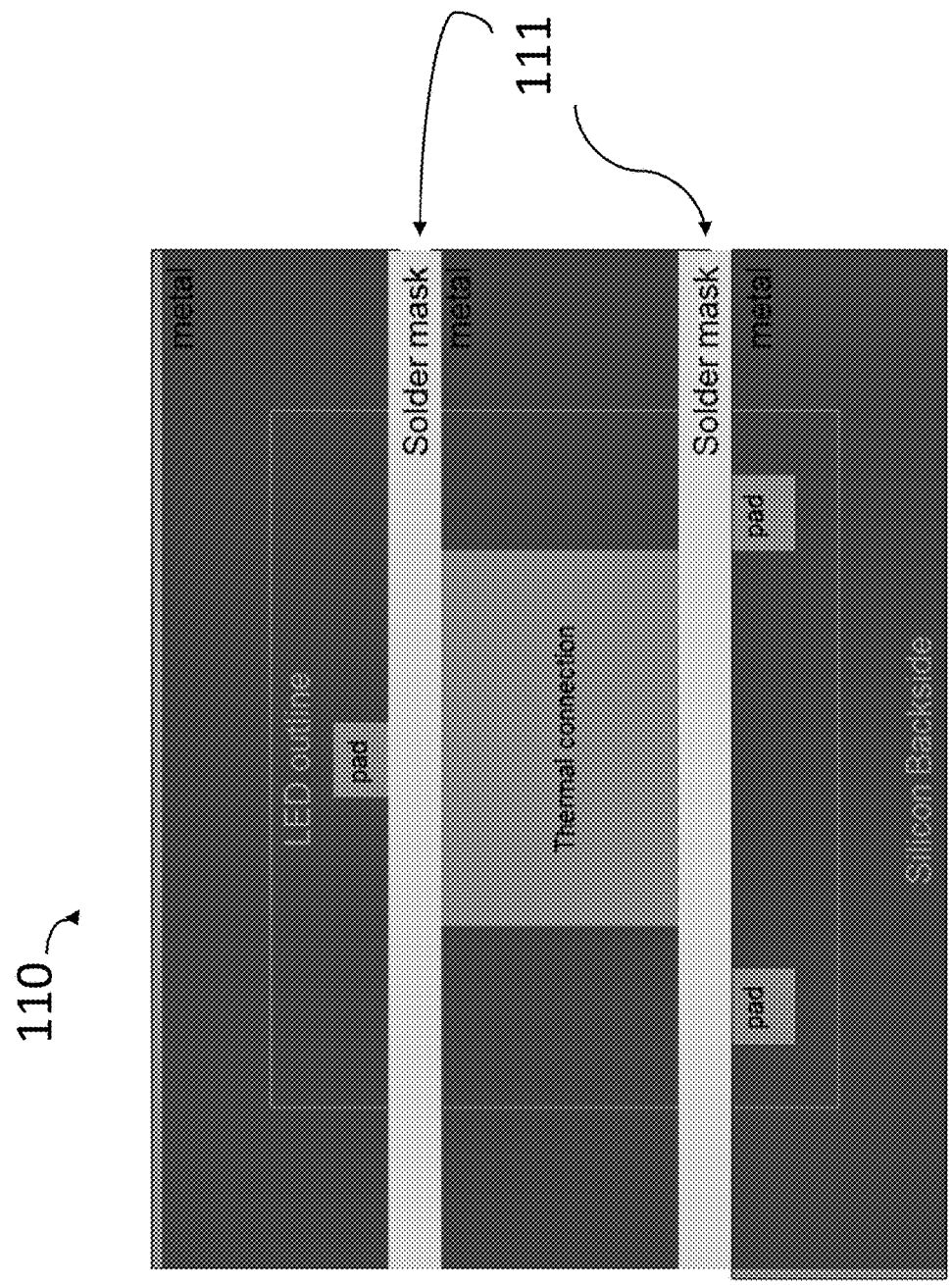
Figure 12:
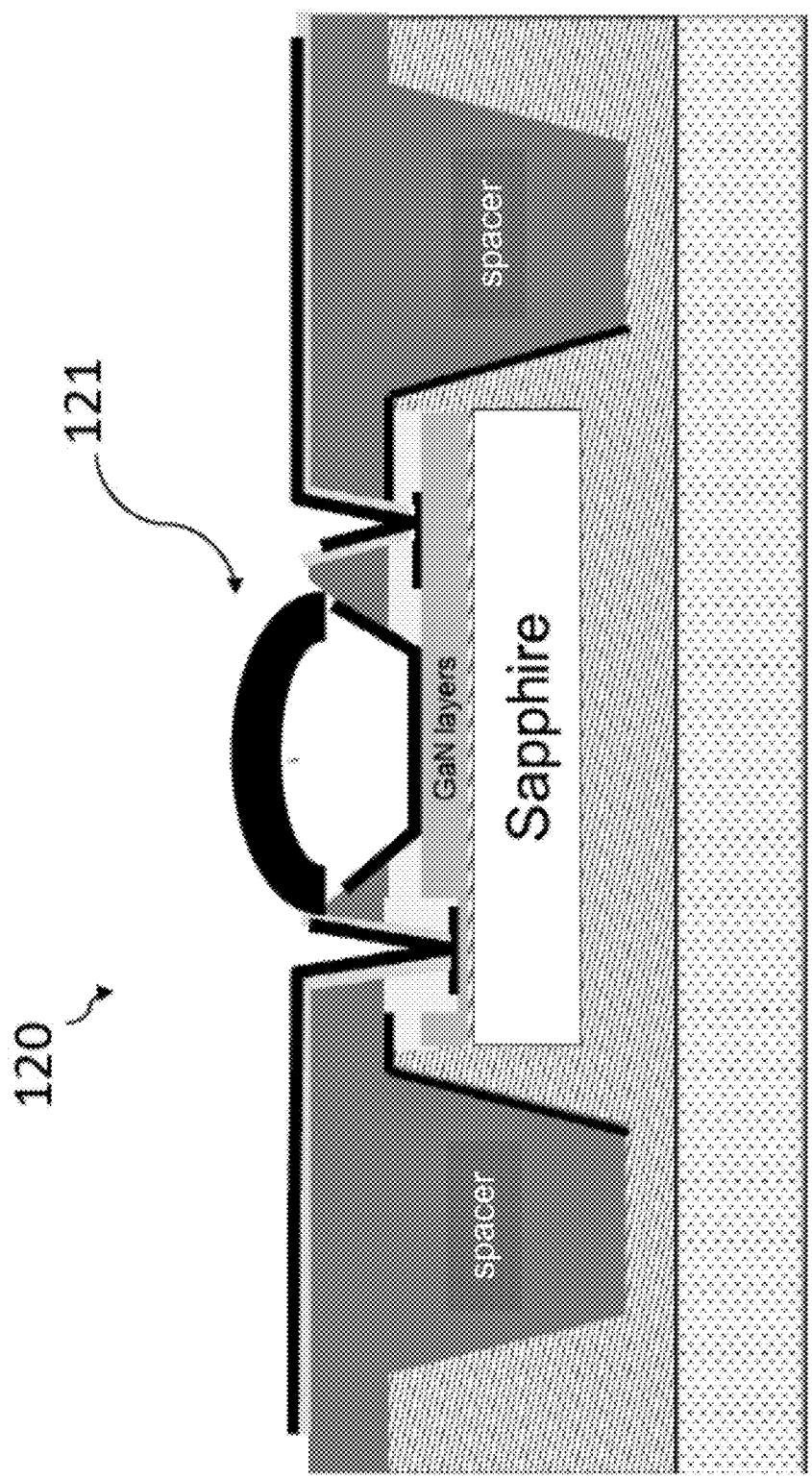

FIG. 4 portrays an exemplary LED package with silicone encapsulated peripheral reflectors;

FIG. 5 illustrates an exemplary etching view during wafer processing;

FIG. 6 depicts an exemplary orthogonal view of the wafer after etching vias and thermal conduction pad;

FIG. 7 illustrates an exemplary profile view during wafer processing showing masking placements;

FIG. 8 illustrates an exemplary method of passivation layer disposition;

FIG. 9 illustrates an exemplary wafer with metal patterned thereto;

FIG. 10 demonstrates an exemplary orthogonal view of the wafer with metal patterned thereto;

FIG. 11 demonstrates an exemplary orthogonal view of the wafer showing solder masking; and FIG. 12 illustrates an exemplary LED package with molten metal in a heat sink relief.

DETAILED DESCRIPTION

As mentioned above, the present invention relates to new and improved methods and apparatus for LED packaging to efficiently remove excess heat during active operation. In particular, the present invention discloses LED packaging with enhanced heat conduction using augmented thermal capacity materials and novel methods for processing thereof. Specifically, the present invention either redirects heat away from or bypasses through a silicon substrate in the context of a horizontal LED assembly.

In some embodiments, the present apparatus provides a LED package which conducts heats away from the LED die and reflects light energy away from the wafer. The present invention comprises optically reflective pads with enhanced conduction properties relative to alternate materials which are used currently in the art. In one embodiment, reflecting pads are disposed adjacent to wafer spacers and proximal the LED die. In another embodiment, the reflecting pads are used in concert with an additional reflecting pad disposed directly adjacent to the doped LED surface.

In one or more embodiments, the present invention provides a LED package which conducts excess thermal heat away from the LED device via a novel heat sink apparatus. Its methodology includes creating a void in the wafer beneath the mounted LED die and disposing metal proximate to the doped LED face. This allows for thermal conduction to pass from LED device to the distal face of the silicon wafer.

Modern LED devices are based on semiconducting materials and their properties. For example, some LEDs are made using Gallium Nitride (GaN) which is a type of bandgap semiconductor suited for use in high power LEDs. Ga LEDs are typically epitaxially grown on a sapphire substrate. These LEDs comprise a P-I-N junction device having an intrinsic (I) layer disposed between a N-type doped layer and a P-type doped layer. The device is driven using suitable electrical driving signals by way of electrodes or contacts coupled to the N and the P type portions of the LED. Electronic activity causes the emission of visible electromagnetic radiation (light) from the intrinsic portion of the device according to the electromotive force applied thereto and configuration of the device.

The embodiments described and illustrated herein are not meant by way of limitation, and are rather exemplary of the kinds of features and techniques that those skilled in the art might benefit from in implementing a wide variety of useful products and processes. For example, in addition to the applications described in the embodiments below, those skilled in the art would appreciate that the present disclosure can be applied to making and packaging power integrated circuit (IC) components, radio frequency (RF) components, micro electro-mechanical systems (MEMS), or other discrete components.

Figure 1:
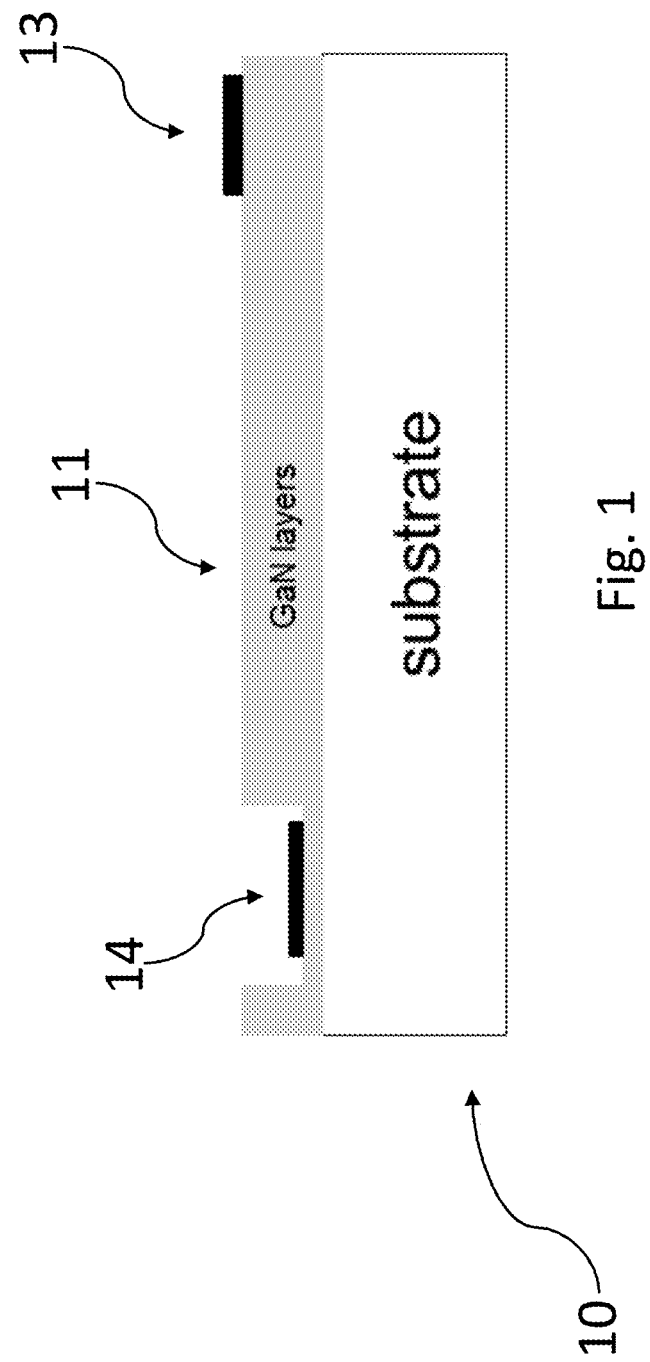
FIG. 1 represents the state of the art GaN LED chip.

Gallium Nitride LEDs can be epitaxially grown on Silicon, GaN, SiC or Sapphire substrates. FIG. 1 represents a characteristic horizontal-type Ga LED chip 10. As described, GaN layers 11 are grown upon a substrate 12. GaN is chosen for its wide band-gap and high brightness properties. At minimum, GaN layers 11 comprise a n-type doped region disposed directly adjacent to substrate 12 and electrically connected to pad 14 and p-type doped region electrically connected to pad 13.

An active region makes up the interface of the GaN layers between the p-type and n-type regions. The active region is between 10 to 20 microns thick and the source of photon emission where electron/hole recombination occurs. LEDs can be of two main types: horizontal and vertical. In a horizontal LED, the substrate is electrically isolating such as sapphire, whereas the substrate in vertical LED is a conducting material such as SiC or GaN.

Figure 2:
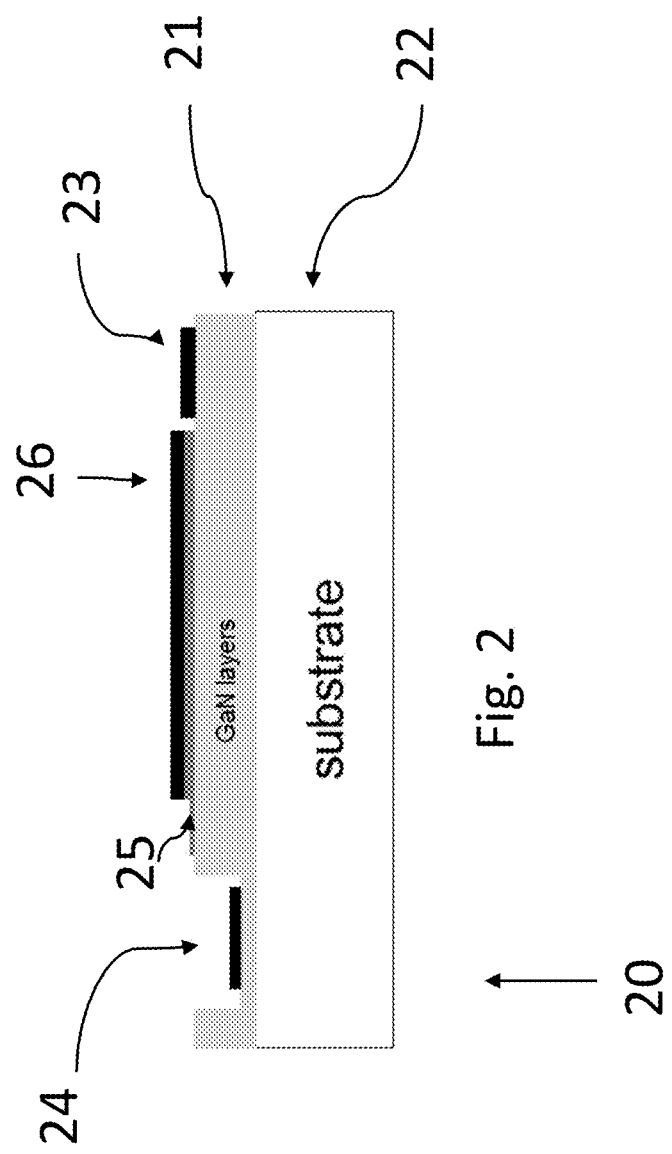
FIG. 2 depicts an exemplary LED die with a reflective layer in a horizontal construction.

FIG. 2 depicts an exemplary LED die 20 with a reflective layer 26 in a horizontal construction. In one embodiment, the reflective layer 26 comprises a silver (Ag) or aluminum (Al) conductive metal pad which is deposited and patterned on the top of the wafer. In the present embodiment, the reflective layer is electrically isolated. In that, the conductive metal pad passes no current. Alternatively, the reflective layer 26 can connect to electrical conductive fingers which provide efficient current distribution to the surface of the LED. In this configuration, reflective layer 26 can be in electrical communication with p-type pad 23 or replace it entirely.

In another embodiment, two media (25, 26) of increasing indices of refraction are used as to reflect light back through GaN layers 21 and sapphire substrate 22. Transparent electrode 25 is fabricated from a transparent electrode material, such as, indium tin oxide (ITO) or zinc oxide (ZnO). In some embodiments, transparent electrode 25 conveys electric power to GaN layers 21 and covers the whole LED area. Reflective surface 26 and transparent electrode material 25 have thicknesses of 0.5-5 microns. N-type pad 24 and p-type pad 23 is also fabricated to provide optical reflections as we as electrical contracts comprising Al or Ag to optimize shorter wavelengths below 500 nm which GaN produces.

In other embodiment the pads 23, 24, and reflective surface 26 can be fabricated with Gold Tin (Ag Sn) layers to enable eutectic bonding of the LED to LED carrier. As is known in the art, a eutectic system is a mixture of chemical compounds or elements that have a single chemical composition that solidifies at a lower temperature than any other composition made up of the same ingredients.

In those embodiments using conductive pads or layers, electrical isolation must be provided from the GaN layers. This can be achieved with a silicon oxide (SiO) layer deposited using plasma enhanced chemical vapor deposition (PECVD). Since current manufacturing processes include SiO passivation, a layer is all that is required is to pattern the electrical pads and then deposit a second metal later for the reflective pad. The reflective layer(s) will also be used as a pad contact for heat dissipation. More information is disclosed in the related application U.S. patent application Ser. No. 13/424,875 entitled, "Wafer Level Packaging of Electronic Devices" which is hereby incorporated by reference in its entirety.

The LED can be a vertical type LED or horizontal type LED where the pads are designed to be at the same height. GaN layers may be grown on one substrate and transferred to another substrate in a laser lift off technique. Other laser techniques known in the art are also not beyond the scope of the present invention. It should be appreciated that GaN type LEDs are not the only kind of LED materials that can be employed in the present discussion, but that the present description is merely illustrative so that those skilled in the art can appreciate some preferred embodiments and methods for making and designing the present LEDs.

Similarly, in the following preferred and exemplary illustrations, it is to be understood that many other similar and equivalent embodiments will be apparent to those skilled in the art and which accomplish substantially the same result. This is true as to variations in the geometry, layout, configurations, dimensions, and choice of materials and other aspects described in the present examples. Specifically, certain described elements and steps can be omitted, or others can be substituted or added to that which is described herein for the sake of illustration without materially affecting the scope of the present disclosure and inventions.

Figure 3:
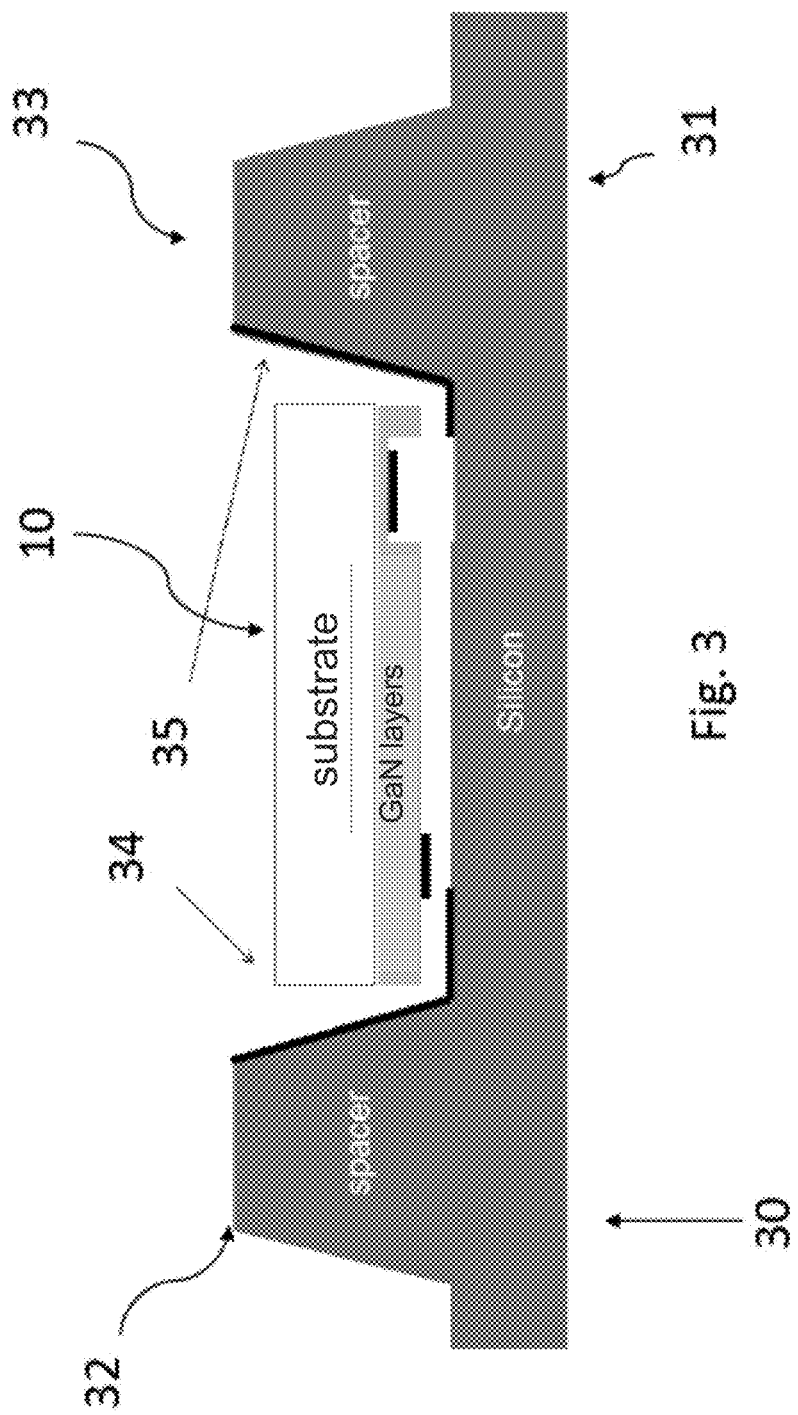
FIG. 3 illustrates an exemplary flip-chip method of LED manufacturing in preparation of wafer level processing.

FIG. 3 illustrates an exemplary flip-chip method of LED manufacturing in preparation of wafer level processing prior to LED die 10 adhesion to silicon wafer 31. In one embodiment, silicon wafer 31 is coated with a reflective material, such as, gold (Au), aluminum (Al), silver (Ag), or a dielectric stack. The coating serves two purposes. It reflects light energy in the generally orthogonal direction away from the silicon wafer 31. And, it also acts as an efficient thermal coupling by conducting heat away from the LED die 10. In one embodiment, the coating can cover the entire wafer with holes for the electrical pads.

In a preferred embodiment of the present invention, the coating is designed to cover the LED undersurface except for areas of electrical pads nor the area designed to be the thermally conducting connection, which will be discussed in greater detail later. Referring to FIG. 3, the coating is patterned and deposited on the silicon wafer 31 engendering peripheral reflectors 34, 35 disposed proximately to spacers 32, 33, respectively. The coating and/or peripheral reflectors 34, 35 can be patterned to provide die attach marks.

The coating is preferably made of metal, such as, Al, Au, Ag, Cu or other conducting material. It should be noted that state of art method of electrode formation includes depositing a SiO2 or other electrically insulating and optically transparent layer on top of the P and exposed N layers. This layer is then exposed using photolithography and chemical etching to reveal the layers in specific locations which become the electrical and thermal contact pads. The metal is then deposited on top the insulating layer and electrical contact is facilitated in the exposed portions. Other state of art techniques include selective doping of contact areas to reduce electrical resistivity.

The metal contact can have a plurality of metal constituents each with a specific purpose, e.g. light reflection, heat conduction, adhesion to the GaN layers or matching the work function of the GaN layers. In another embodiment, the metal cover can be composed of two or more, electrically isolated parts. One part(s) is electrically connected to the p-layer and provides electrical contact as well as thermal contact, and the other part(s) provide optical reflection and thermal connection.

The LED can also be without a reflector layer, and can be of different types such as a vertical LED, or a die attach LED in which both contacts are at the bottom side of the LED.

FIG. 4 portrays an exemplary LED package 40 with silicone encapsulated peripheral reflectors. LED die 10 is affixed to the silicon wafer 31 using a nonconductive epoxy, or silicone adhesive. An example of such a material is Shin Etsu KER-3100-M2 or Epotek ND353. In one embodiment, the adhesive layer 41 comprises, at least in part, material optimized to provide both heat conduction as well as light reflection, diffusion or transparency.

For example, a zinc oxide (ZnO) or boron nitride (BN) filler can be applied to the adhesive layer 41. LED light is reflected at the interface between LED and adhesive layer 41 when reflective material is chosen. Transparent or diffusive adhesive layer(s) 41 pass light from the diode which gets reflected back towards the silicone encapsulation 42 of the peripheral reflectors. The present embodiment can also be used in conjunction with a LED reflector chip 20 in accordance with the detailed description of FIG. 2. As a metric for suitable performance, heat conductions of 3 W/mK or more is sufficient. Adhesive layer 41 can also be designed to be easily removed in an etching or ashing process.

In other embodiments, the LED die 10 is attached to metal bumps using eutectic bonding. The metal bumps are laid out and deposited as part of the peripheral reflectors 34, 35 but patterned to create electrically isolated regions. As described, the metal is deposited on a dielectric layer which provides electrical isolation from the electrical pads to the silicon carrier 30. The dielectric can be silicon oxide (SiO), silicon nitride (SiN), or other inorganic thin films. The layer can also be a thin film of organic material, such as, polyimide or solder mask. The resultant structure in the present embodiment comprises juxtaposed strata of silicon carrier, dielectric, and metal layers.

LED package 40 further comprises silicone encapsulation 42 and photoluminescent layer 43. Silicone encapsulation 42 is an optically transmissive layer filling all voids on the carrier wafer by creating a surface coplanar to the silicon substrate. Photoluminescent layer 43 is comprised of phosphor or quantum dot material enable the conversion of the light generated by the LED to other colors. The most common is the use of phosphor to enable White light from a blue LED. The Silicone encapsulation can be applied using screen printing, spin coating, spray coating, injection molding or other similar process. In an additional embodiment, the encapsulation can be composed of one or more layers, with different refractive indexes or other optical, mechanical or thermal properties in order to reduce reflectance loss of the light, or enhance the mechanical dexterity of the process. In an additional embodiment, the package can be finalized without a cover layer. In this embodiment, the Silicone can also include optical elements such as lenses, diffractive optical patterns, or gratings. These structures will provide optical functions such as focusing, specific light distribution, anti reflective properties, light collection or polarization filtering or reflection. If injection molding is used to create the encapsulated Silicone, the optical patterns can be part of the mold. In another embodiment, the carrier wafer has no side reflectors, 32 in FIG. 3, and the encapsulation provides a continuous layer of material on the carrier wafer.

The LEDs are individually assembled on a carrier wafer, with the sapphire layer facing the carrier wafer layer. An optically transparent cover made of glass, polymer or other materials is then attached to the wafer top. The carrier wafer layer of optically transparent can include other optical components such as lenses or light diffusing structures or light guiding structures. In one embodiment the lens shape is created by the surface tension of a drop of polymer or silicone material. In another embodiment the lens is created by hot embossing of a polymer which is applied to one side of the carrier wafer. The carrier wafer may be further patterned to create specific drop shapes, sizes and desired surface qualities.

The system may be coupled to other optical elements as would be appreciated by those skilled in the art. One or more optical lens or assembly of optical lenses, Fresnel layers, filters, polarizing elements, or other members can be used to further affect the quality of the light provided by the LED device.

In another embodiment, there is an air cavity between the cover and the LED active layer. The air cavity provides a high thermal resistance and reduces the temperature in the cover. The reduced temperature increases the lifetime of phosphor or quantum dot material. To create the air cavity, a photo definable material is deposited on the cover substrate.

The photo definable material can be solder mask material or photoresist, such as, BCB, SU8, or other suitable polymer materials known in the art. After deposition, the cavity is defined and imaged leaving material at the cavity boundaries to support the contact to the LED active surface. Additional such cavities can be defined and multiple cover substrates can be used to define cavities for the phosphor material as well as for optical elements such as lenses or diffusers. In one embodiment the lens shape is created by the surface tension of a drop of polymer or silicone material. The cover substrate may be patterned to create specific drop shapes, sizes and surface qualities. The glass can be loaded with phosphor material during production. The glass may also include particles to induce light diffusion.

The cover substrate is bonded to the LED active layer using epoxy, silicone or BCB or other suitable material. In additional embodiments, the package can be done without a cover substrate. In this case the top most layer would be the encapsulant Silicone layer or the encapsulant and Phosphor filler layer. As described above, the encapsulant layer can also include optical elements such as lenses.

FIG. 5 illustrates an exemplary etching view during wafer processing. After attaching the cover substrate 54 to the LED package 50, the distal side silicon wafer 31 is ground to a thickness of less than 100 microns. Reducing the thickness of the silicon enhances the thermal conductance of the LED package 50 and reduces the temperature of the LED during operation. The process of back grinding induces wafer stress that can propagate into the bulk of the wafer causing it weaken. After grinding, a stress relief is etched in plasma and vias (holes) 51, 52 are etched in the distal side of the silicon wafer 31.

There are two types of geometrical reliefs which are evident in the FIG. 5 profile of the LED package 50, which is provided by way of illustration. Those skilled in the art will appreciate that the present examples can be generalized and applied to other specific designs and uses. The first type is a via (hole). A via is an electrical connection between layers in a physical electronic circuit that goes through the plane of one or more adjacent layers. Electrical connection vias 51,52 are etched through the remainder of the silicon wafer 31 and adhesion layer 41 to provide pathways to the electrical pads 55, 56 in the LED package 50. Via diameters are in between 10 to 150 microns and preferably greater than 60 microns. Via angles range from 45 to 90 degrees and preferably between 60 and 70 degrees.

A second type of geometrical relief is a thermally conducting hole 53 pursuant to the present invention. Thermally conducting hole 53 is etched through the remainder of the silicon wafer 31 and at least part of adhesion layer 41 in a location proximate to the GaN layers of the LED package 50. It preferably displaces much of the silicon and adhesive volume proximate the LED die. In one embodiment, the surface area displacement of thermally conducting hole 53 is 250000 microns$^2$. In others, the area can be greater than 700 microns by 700 microns. As indicated, the etching is performed until reaching the adhesive layer 41

In an embodiment, all of exposed adhesive layer 41 is removed. This can be accomplished using the silicon reactive ion etch used with silicon wafer 31 or by changing the chemistry to an oxygen rich etch (ashing). More specifically, since the adhesive layer is either an epoxy based or Silicone based layer, it is expected that that chemistry used for via etching, namely $SF_4$ or $SF_6$, will not be effective in etching the adhesive layer. In case the adhesive layer is composed of Silicone, then adding $O_2$ to the $SF_4$ or $SF_6$ process can result in an anistropic etch of the adhesive layer. Alternatively, the adhesive layer is removed in a second process of only $O_2$ plasma. Alternatively, the removal of the adhesion layer 41 can also be executed using a wet chemical etch or other suitable means which is known in the art. In the embodiment where the LED die has a reflective layer 26, the metal layer can act as etch stop layer, in another embodiment the LED passivation layer such as $SiO_2$, will act as the etch stop layer In the context of the embodiment where thermal conductance of the adhesion layer 41 is above 1 W/mK, some of the adhesion layer 41 can remain in the thermally conducting hole 53. Also if the adhesive is designed to be highly reflective such as a Silicone with Zinc Nitride particles, and there is no reflector layer on the LED, it may be desired to leave 1-5 microns of the adhesive FIG. 6 depicts an exemplary orthogonal view of the LED package 60 as seen from the side of the silicon wafer 31 after etching vias 51, 52 and thermal conduction hole 53. As is common in LED packaging, LED die 10 comprises two n-type electrical pads 61 and on p-type electrical pad. As previously enumerated, any of the shown elements can have some type of reflective composition in addition to the property of high thermal conductivity.

FIG. 7 illustrates an exemplary profile view of the LED package 70 during wafer processing showing masking placements. After etching, a passivation layer will be applied to the distal side of the silicon wafer 31. he passivation layer is typically an organic material and hence not a good heat conductor. It would be desired to remove the passivation layer from the thermal via. In one embodiment, we use a shadow mask to prevent formation of the passivation in the thermal hole. In this case, prior to passivation, the area designated as the thermally conductive hole 53 is covered using a shadow mask 71. Shadow mask 71 comprises any suitable material which can be patterned with the substantially same dimensions and location as the thermally conductive hole 53. Exposed vias 51, 52 are areas to be passivated. Where there are area not to designated for passivation, blocking material 72 is patterned and deposited, or vise-versa.

FIG. 8 illustrates an exemplary method of passivating the carrier side of a LED package 80 according to one embodiment of the present invention. Passivation layer 81 applied to the distal side of the silicon wafer 31. The shadow mask 71 and blocking material 72 is then selectively removed, as is known in the art. In another embodiment, the shadow mask 71 is foregone and the passivation layer can be selectively patterned after deposition.

In one embodiment, the passivation layer is a photo imageable material such as WLP 32, or other solder mask like material. In this case, the use of standard photo lithography masks, imaging system, and developing process will result in holes both for the thermal via as well as electrical vias.

In another embodiment, a hard mask layer is deposited on the passivation material. The hard mask can be a metal such a Al, or isolating material such as SiN or $SiO2$. The mask layer may to be applied at a low temperature process which will not damage the polymer Passivation layer. The mask layer can be thick enough so that the passivation layer can be etched without dimension changes in the mask layer. In most cases 1-5 micron should suffice. A photo resist is deposited on the mask layer and patterned. The mask layer is then patterned using a selective wet etch so that only the mask material is removed. Then the underlying passivation layer and potentially die attach adhesive layer is etched. In most cases the etching would be done in $O_2$ plasma.

The passivation layer 81 is a nonconductive layer comprising $SiO2$, SiN, AlN, $Al2O3$ or organic material, such as, epoxy, or electrophoretic deposited paint as used in the car industry or spray coating. Passivation layer 81 thickness ranges from 1 to 40 microns, depending on the material and required electrical passivity. Alternatively the passivation layer is a thermally conductive layer such as SiN or AlN which is used to minimize the thermal conductance of the package.

The passivation layer is also removed to enhance the heat conduction of the LED. Hence to optimize the heat conductance, a maximal contact should be made between the metal and metal pads on the LED and the metal layer. This is done by opening the largest possible area on the passivation layer and preferably greater than 80%. If the LED is designed with a thermal pad structure then the P connection can be connected to thermal and P pad or alternatively three metal connections are facilitated, N, P and thermal.

In another embodiment, the passivation is also removed in areas where there is no metal layer, only the electrically insulating layer. This can occur, if instead of the LED described previously, a standard LED is used in which the metal covers only a small portion of the top of the LED. In this case the metal layer deposited in this stage will provide the heat removal and light reflection. In this manner, the exposed portions of the LED will extend beyond the metal areas. The newly deposited metal will again cover substantially all of the LED structure.

In another embodiment, if the electrical passivation layer is optically reflecting and heat conducting the layer may be maintained and the metal passivation will cover substantially all the LED area but will make a direct connection to the LED metal pads, and in other areas the connection layers would be through the passivation layer, i.e. the layer stack would be, LED, LED passivation layer, packaging passivation layer which provides low thermal resistance and light reflection, packaging metal for heat conduction.

FIG. 9 illustrates an exemplary wafer 90 with metal seed layer 91 patterned thereto. In preparation for the metal deposition, some of the passivation layer 81 must be removed so that electrical and thermal contact can be made with the pads. Electrical and thermal contact holes are drilled through the passivation layer until reaching the metal pad. If a laser is used, the laser can either stop at the metal pad (blind via) or cut through the pad and the electrical connection would then be done using the pad side wall thickness. A plasma etch can also be used to create the contact holes in the same processing step as the etch for the thermal connection, If SiN or SiO2 are in passivation.

The metal seed layer 91 comprises aluminum, titanium, chrome, nickel, palladium, platinum, copper or combinations thereof. Metal seed layer 91 is deposited using sputtering or other suitable means. In one embodiment, aluminum is initially deposited as the metal seed layer 91 to provide good reflectivity from the LED surface towards the LED backside and output from the LED package 90.

FIG. 10 demonstrates an exemplary orthogonal view of the wafer 100 with metal patterned thereto. Metal seed layer can be patterned using electrophoretic deposited photo resist, spray coating resist, or thick resist. The resist is patterned to create the electrical routing connections and under bump metallization, as well as the metallization for the heat conducting element. After patterning the resist, a thick metal layer (between 10 and 40 microns) is plated in the predetermined pattern, such as, metal strips 101, 102, 103. The resist is removed, and the bare seed layer is etched by using a wet metal etch.

FIG. 11 demonstrates an exemplary orthogonal view of the wafer 110 showing solder masking 111. The heat conduction element is a direct metal connection from a significant portion of the area of the LED to the printed circuit board to which the LED is attached.

FIG. 12 illustrates an exemplary LED package 120, where the recess of the thermal connection is filled with metal. One embodiment of filling metal or metal laden polymer can done using a screen printing process akin to the process where solder bumps are made in standard BGA packages. In this technology, solder paste, which is a polymer laden with Tin is applied in a screen printing machine. The print is applied to selected areas, in this case the thermal holes. A further reflow process may be done, in which the polymer material is evaporated and the shape of the Tin (Sn) or other metal may be changed by melting it into the desired thermal via recess. in this case the thermal via recess will be filled with metal. In another embodiment, the metal may be applied in the manner of a Solder ball which is dropped in place from suitable machines. Such machines are known in the art and used in Ball Grid Area (BGA) electronic packages. After dropping the ball in place, the material can again be reflowed, to occupy the thermal recess. Alternatively, the structure can be reflowed as part of the SMT assembly process. The metal filler 121, is shown in FIG. 12. The metal can be any of state of art BGA balls such as Sn96.5 Ag3.0 Cu0.5, or other corn positions of Sn, Ag, Cu, or Sn Pb Ag com positions. The filler can also be other heat con ducting materials including polymers with heat conducting fillers such as Ag, BN, SiN, AlN, and others.

The present invention should not be considered limited to the particular embodiments described above, but rather should be understood to cover all aspects of the invention as fairly set out in the attached claims. Various modifications, equivalent processes, as well as numerous structures to which the present invention may be applicable, will be readily apparent to those skilled in the art to which the present invention is directed upon review of the present disclosure. The claims are intended to cover such modifications and equivalents.

What is claimed is:

1. A light emitting device, comprising:
   a substrate having opposing first and second substrate surfaces;
   a semiconductor LED including doped and intrinsic regions thereof, said semiconductor LED having opposing first and second LED surfaces, said first LED surface disposed on the first substrate surface;
   a thermally conductive layer disposed on the second LED surface of the semiconductor LED;
   a carrier wafer disposed on the thermally conductive layer;
   at least one optically reflective surface disposed between said carrier wafer and said semiconductor LED; and
   a substantially optically transmissive layer disposed proximal to the second substrate surface,
   wherein the carrier wafer and the thermally conductive layer define a relief to expose at least a portion of the second LED surface.

2. The light emitting device of claim 1, said at least one optically reflective surface comprising metal.

3. The light emitting device of claim 1, said at least one optically reflective surface comprising a dielectric stack.

4. The light emitting device of claim 1, wherein said semiconductor LED is affixed to said carrier wafer with an adhesive material which has the property of high thermal conductivity.

5. The light emitting device of claim 1, wherein said semiconductor LED is affixed to said carrier wafer with an adhesive material which has the property of optical diffusion.

6. The light emitting device of claim 1, wherein said semiconductor LED is affixed to said carrier wafer with an adhesive material which has the property of optical reflection.

7. The light emitting device of claim 1, wherein said semiconductor LED is affixed to said carrier wafer with an adhesive material which has the property of optical transmissivity.

8. The light emitting device of claim 1, further comprising at least one spacer attached to said carrier wafer; whereby, said at least one optically reflective surface is affixed thereto.

9. The light emitting device of claim 1, said thermally conductive layer comprises metal.

10. The light emitting device of claim 1, said thermally conductive layer comprises an organic material with a physical property of high thermal conductivity.

11. The light emitting device of claim 1, wherein the relief has a surface area displacement of 250,000 square microns.

12. The light emitting device of claim 1, wherein the relief has a surface area displacement of at least 700 microns by 700 microns.

* * * * *

(12) EX PARTE REEXAMINATION CERTIFICATE (12619th)
United States Patent
Margalit

(10) Number: US 9,502,612 C1
(45) Certificate Issued: Jun. 3, 2024

(54) LIGHT EMITTING DIODE PACKAGE WITH ENHANCED HEAT CONDUCTION

(71) Applicant: Mordehai Margalit, Zichron Yaaqov (IL)

(72) Inventor: Mordehai Margalit, Zichron Yaaqov (IL)

(73) Assignee: LED WAFER SOLUTIONS LLC

Reexamination Request:
No. 90/015,091, Aug. 15, 2022
No. 90/015,134, Oct. 14, 2022

Reexamination Certificate for:
Patent No.: 9,502,612
Issued: Nov. 22, 2016
Appl. No.: 14/047,715
Filed: Oct. 7, 2013

Related U.S. Application Data

(63) Continuation-in-part of application No. 13/424,875, filed on Mar. 20, 2012, now Pat. No. 9,406,854, which is a continuation-in-part of application No. PCT/IL2010/000772, filed on Sep. 20, 2010.

(60) Provisional application No. 61/710,156, filed on Oct. 5, 2012, provisional application No. 61/351,875, filed on Jun. 5, 2010, provisional application No. 61/244,046, filed on Sep. 20, 2009.

(51) Int. Cl.
| | |
|---|---|
| *H01L 33/38* | (2010.01) |
| *H01L 33/10* | (2010.01) |
| *H01L 33/46* | (2010.01) |
| *H01L 33/48* | (2010.01) |
| *H01L 33/52* | (2010.01) |
| *H01L 33/62* | (2010.01) |
| *H01L 33/64* | (2010.01) |

(52) U.S. Cl.
CPC ............ *H01L 33/382* (2013.01); *H01L 33/10* (2013.01); *H01L 33/486* (2013.01); *H01L 33/62* (2013.01); *H01L 33/46* (2013.01); *H01L 33/48* (2013.01); *H01L 33/483* (2013.01); *H01L 33/52* (2013.01); *H01L 33/64* (2013.01); *H01L 33/647* (2013.01); *H01L 2224/24* (2013.01); *H01L 2924/00* (2013.01); *H01L 2924/12044* (2013.01); *H01L 2924/1461* (2013.01); *H01L 2933/0066* (2013.01)

(58) Field of Classification Search
None
See application file for complete search history.

(56) References Cited

To view the complete listing of prior art documents cited during the proceedings for Reexamination Control Numbers 90/015,091 and 90/015,134, please refer to the USPTO's Patent Electronic System.

*Primary Examiner* — Minh Nguyen

(57) ABSTRACT

A light emitting diode (LED) device and packaging with enhance heat conduction. An LED in a wafer level processing (WLP) package is disclosed using vias in the silicon to route the electrical connections to the LED backside and a dedicated hole in the silicon with a direct heat conduction route from the LED to the printed circuit board. Certain layers act to promote mechanical, electrical, thermal, or optical characteristics of the device. The device avoids or ameliorates heat dissipation problems found in conventional LED devices. Some embodiments include a plurality of optically permissive layers, including an optically permissive cover substrate comprising phosphors and/or quantum dots.

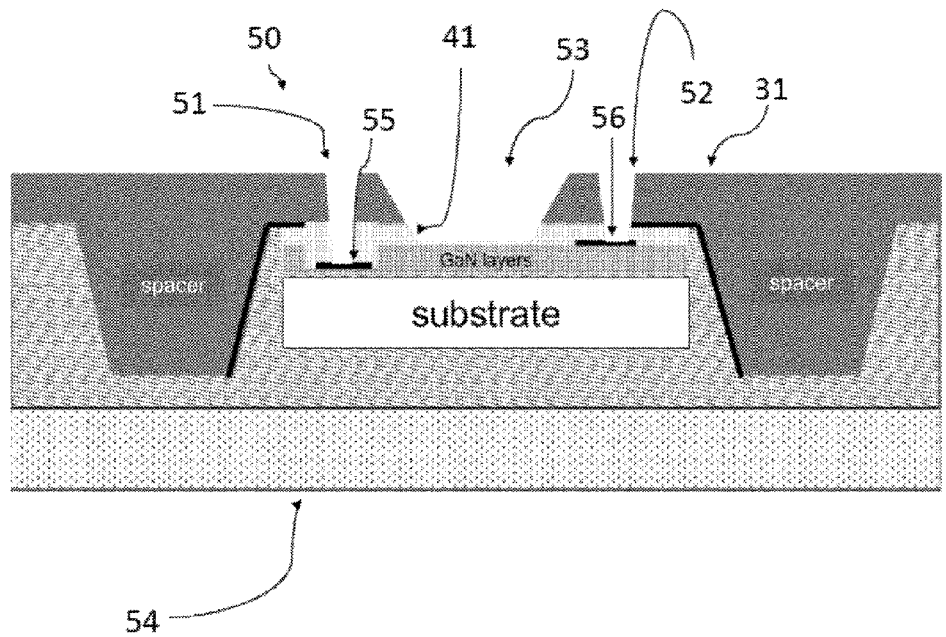

EX PARTE REEXAMINATION CERTIFICATE

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 11-12 are cancelled.

Claim 1 is determined to be patentable as amended.

Claims 2-10, dependent on an amended claim, are determined to be patentable.

New claims 13-72 are added and determined to be patentable.

1. A light emitting device, comprising:
a substrate having opposing first and second substrate surfaces;
a semiconductor LED including doped and intrinsic regions thereof,
said semiconductor LED having opposing first and second LED surfaces, said first LED surface disposed on the first substrate surface;
a thermally conductive layer disposed on the second LED surface of the semiconductor LED;
a carrier wafer disposed on the thermally conductive layer;
at least one optically reflective surface disposed between said carrier wafer and said semiconductor LED; and
a substantially optically transmissive layer disposed proximal to the second substrate surface,
wherein the carrier wafer and the thermally conductive layer define a relief to expose at least a portion of the second LED surface, *the relief has a surface area displacement of 250,000 square microns or at least 700 microns by 700 microns.*

13. *A light emitting device, comprising:*
*a substrate having opposing first and second substrate surfaces;*
*a semiconductor LED including doped and intrinsic regions thereof,*
*the semiconductor LED having opposing first and second LED surfaces, the first LED surface disposed on the first substrate surface;*
*a thermally conductive layer disposed on the second LED surface of the semiconductor LED;*
*a carrier wafer disposed on the thermally conductive layer;*
*at least one optically reflective surface disposed between the carrier wafer and the semiconductor LED;*
*a substantially optically transmissive layer disposed proximal to the second substrate surface; and*
*an electrode disposed on the semiconductor LED,*
*wherein the carrier wafer and the thermally conductive layer define a relief to expose at least a portion of the second LED surface, the relief has a surface area displacement of 250,000 square microns or at least 700 microns by 700 microns,*
*wherein the thermally conductive layer comprises a surface area greater than a surface area of the electrode.*

14. *The light emitting device of claim 13, the at least one optically reflective surface comprising metal.*

15. *The light emitting device of claim 13, the at least one optically reflective surface comprising a dielectric stack.*

16. *The light emitting device of claim 13, wherein the semiconductor LED is affixed to the carrier wafer with an adhesive material which has the property of high thermal conductivity.*

17. *The light emitting device of claim 13, wherein the semiconductor LED is affixed to the carrier wafer with an adhesive material which has the property of optical diffusion.*

18. *The light emitting device of claim 13, wherein the semiconductor LED is affixed to the carrier wafer with an adhesive material which has the property of optical reflection.*

19. *The light emitting device of claim 13, wherein the semiconductor LED is affixed to the carrier wafer with an adhesive material which has the property of optical transmissivity.*

20. *The light emitting device of claim 13, further comprising at least one spacer attached to the carrier wafer whereby the at least one optically reflective surface is affixed thereto.*

21. *The light emitting device of claim 13, the thermally conductive layer comprising metal.*

22. *The light emitting device of claim 13, the thermally conductive layer comprising an organic material with a physical property of high thermal conductivity.*

23. *A light emitting device, comprising:*
*a substrate having opposing first and second substrate surfaces;*
*a semiconductor LED including doped and intrinsic regions thereof,*
*the semiconductor LED having opposing first and second LED surfaces, the first LED surface disposed on the first substrate surface;*
*a thermally conductive layer disposed on the second LED surface of the semiconductor LED;*
*a carrier wafer disposed on the thermally conductive layer;*
*at least one optically reflective surface disposed between the carrier wafer and the semiconductor LED; and*
*a substantially optically transmissive layer disposed proximal to the second substrate surface,*
*wherein the carrier wafer and the thermally conductive layer define a relief to expose at least a portion of the second LED surface, the relief has a surface area displacement of 250,000 square microns or at least 700 microns by 700 microns,*
*wherein the thermally conductive layer has a surface area,*
*wherein the surface area of the thermally conductive layer comprises a majority of a surface area of the second LED surface.*

24. *The light emitting device of claim 23, the at least one optically reflective surface comprising metal.*

25. *The light emitting device of claim 23, the at least one optically reflective surface comprising a dielectric stack.*

26. *The light emitting device of claim 23, wherein the semiconductor LED is affixed to the carrier wafer with an adhesive material which has the property of high thermal conductivity.*

27. *The light emitting device of claim 23, wherein the semiconductor LED is affixed to the carrier wafer with an adhesive material which has the property of optical diffusion.*

28. The light emitting device of claim 23, wherein the semiconductor LED is affixed to the carrier wafer with an adhesive material which has the property of optical reflection.

29. The light emitting device of claim 23, wherein the semiconductor LED is affixed to the carrier wafer with an adhesive material which has the property of optical transmissivity.

30. The light emitting device of claim 23, further comprising at least one spacer attached to the carrier wafer whereby the at least one optically reflective surface is affixed thereto.

31. The light emitting device of claim 23, the thermally conductive layer comprises metal.

32. The light emitting device of claim 23, the thermally conductive layer comprises an organic material with a physical property of high thermal conductivity.

33. A light emitting device, comprising:
a substrate having opposing first and second substrate surfaces;
a semiconductor LED including doped and intrinsic regions thereof,
the semiconductor LED having opposing first and second LED surfaces, the first LED surface disposed on the first substrate surface;
a thermally conductive layer disposed on the second LED surface of the semiconductor LED;
a carrier wafer disposed on the thermally conductive layer;
a via through the carrier wafer and comprising an electrically conductive material;
at least one optically reflective surface disposed between the carrier wafer and the semiconductor LED; and
a substantially optically transmissive layer disposed proximal to the second substrate surface,
wherein the carrier wafer and the thermally conductive layer define a relief to expose at least a portion of the second LED surface, the relief has a surface area displacement of 250,000 square microns or at least 700 microns by 700 microns.

34. The light emitting device of claim 33, the at least one optically reflective surface comprising metal.

35. The light emitting device of claim 33, the at least one optically reflective surface comprising a dielectric stack.

36. The light emitting device of claim 33, wherein the semiconductor LED is affixed to the carrier wafer with an adhesive material which has the property of high thermal conductivity.

37. The light emitting device of claim 33, wherein the semiconductor LED is affixed to the carrier wafer with an adhesive material which has the property of optical diffusion.

38. The light emitting device of claim 33, wherein the semiconductor LED is affixed to the carrier wafer with an adhesive material which has the property of optical reflection.

39. The light emitting device of claim 33, wherein the semiconductor LED is affixed to the carrier wafer with an adhesive material which has the property of optical transmissivity.

40. The light emitting device of claim 33, further comprising at least one spacer attached to the carrier wafer whereby the at least one optically reflective surface is affixed thereto.

41. The light emitting device of claim 33, the thermally conductive layer comprises metal.

42. The light emitting device of claim 33, the thermally conductive layer comprises an organic material with a physical property of high thermal conductivity.

43. A light emitting device, comprising:
a substrate comprising an epitaxial layer, the epitaxial layer having opposing first and second substrate surfaces;
a semiconductor LED including doped and intrinsic regions thereof,
the semiconductor LED having opposing first and second LED surfaces, the first LED surface disposed on the first substrate surface;
a thermally conductive layer disposed on the second LED surface of the semiconductor LED;
a carrier wafer disposed on the thermally conductive layer;
at least one optically reflective surface disposed between the carrier wafer and the semiconductor LED; and
a substantially optically transmissive layer disposed proximal to the second substrate surface,
wherein the carrier wafer and the thermally conductive layer define a relief to expose at least a portion of the second LED surface, the relief has a surface area displacement of 250,000 square microns or at least 700 microns by 700 microns.

44. The light emitting device of claim 43, the at least one optically reflective surface comprising metal.

45. The light emitting device of claim 43, the at least one optically reflective surface comprising a dielectric stack.

46. The light emitting device of claim 43, wherein the semiconductor LED is affixed to the carrier wafer with an adhesive material which has the property of high thermal conductivity.

47. The light emitting device of claim 43, wherein the semiconductor LED is affixed to the carrier wafer with an adhesive material which has the property of optical diffusion.

48. The light emitting device of claim 43, wherein the semiconductor LED is affixed to the carrier wafer with an adhesive material which has the property of optical reflection.

49. The light emitting device of claim 43, wherein the semiconductor LED is affixed to the carrier wafer with an adhesive material which has the property of optical transmissivity.

50. The light emitting device of claim 43, further comprising at least one spacer attached to the carrier wafer whereby the at least one optically reflective surface is affixed thereto.

51. The light emitting device of claim 43, the thermally conductive layer comprises metal.

52. The light emitting device of claim 43, the thermally conductive layer comprises an organic material with a physical property of high thermal conductivity.

53. A light emitting device, comprising:
a substrate having opposing first and second substrate surfaces;
a semiconductor LED including doped and intrinsic regions thereof,
the semiconductor LED having opposing first and second LED surfaces, the first LED surface disposed on the first substrate surface;
a thermally conductive layer comprising an adhesive and disposed on the second LED surface of the semiconductor LED;
a carrier wafer disposed on the thermally conductive layer;

at least one optically reflective surface disposed between the carrier wafer and the semiconductor LED; and a substantially optically transmissive layer disposed proximal to the second substrate surface, wherein the carrier wafer and the thermally conductive layer define a relief to expose at least a portion of the second LED surface, the relief has a surface area displacement of 250,000 square microns or at least 700 microns by 700 microns.

54. The light emitting device of claim 53, the at least one optically reflective surface comprising metal.

55. The light emitting device of claim 53, the at least one optically reflective surface comprising a dielectric stack.

56. The light emitting device of claim 53, wherein the semiconductor LED is affixed to the carrier wafer with an adhesive material which has the property of high thermal conductivity.

57. The light emitting device of claim 53, wherein the semiconductor LED is affixed to the carrier wafer with an adhesive material which has the property of optical diffusion.

58. The light emitting device of claim 53, wherein the semiconductor LED is affixed to the carrier wafer with an adhesive material which has the property of optical reflection.

59. The light emitting device of claim 53, wherein the semiconductor LED is affixed to the carrier wafer with an adhesive material which has the property of optical transmissivity.

60. The light emitting device of claim 53, further comprising at least one spacer attached to the carrier wafer whereby the at least one optically reflective surface is affixed thereto.

61. The light emitting device of claim 53, the thermally conductive layer comprises metal.

62. The light emitting device of claim 53, the thermally conductive layer comprises an organic material with a physical property of high thermal conductivity.

63. A light emitting device, comprising:

a substrate having opposing first and second substrate surfaces;

a semiconductor LED including doped and intrinsic regions thereof, the semiconductor LED having opposing first and second LED surfaces, the first LED surface disposed on the first substrate surface;

a thermally conductive layer comprising a thermal management layer disposed on the second LED surface of the semiconductor LED;

a carrier wafer disposed on the thermally conductive layer;

at least one optically reflective surface disposed between the carrier wafer and the semiconductor LED; and a substantially optically transmissive layer disposed proximal to the second substrate surface, wherein the carrier wafer and the thermally conductive layer define a relief to expose at least a portion of the second LED surface, the relief has a surface area displacement of 250,000 square microns or at least 700 microns by 700 microns.

64. The light emitting device of claim 63, the at least one optically reflective surface comprising metal.

65. The light emitting device of claim 63, the at least one optically reflective surface comprising a dielectric stack.

66. The light emitting device of claim 63, wherein the semiconductor LED is affixed to the carrier wafer with an adhesive material which has the property of high thermal conductivity.

67. The light emitting device of claim 63, wherein the semiconductor LED is affixed to the carrier wafer with an adhesive material which has the property of optical diffusion.

68. The light emitting device of claim 63, wherein the semiconductor LED is affixed to the carrier wafer with an adhesive material which has the property of optical reflection.

69. The light emitting device of claim 63, wherein the semiconductor LED is affixed to the carrier wafer with an adhesive material which has the property of optical transmissivity.

70. The light emitting device of claim 63, further comprising at least one spacer attached to the carrier wafer whereby the at least one optically reflective surface is affixed thereto.

71. The light emitting device of claim 63, the thermally conductive layer comprises metal.

72. The light emitting device of claim 63, the thermally conductive layer comprises an organic material with a physical property of high thermal conductivity.

* * * * *